United States Patent [19]
Yang

[11] Patent Number: 5,808,293
[45] Date of Patent: Sep. 15, 1998

[54] PHOTO DETECTOR WITH AN INTEGRATED MIRROR AND A METHOD OF MAKING THE SAME

[75] Inventor: Long Yang, Union City, Calif.

[73] Assignee: Hewlett-Packard Company, Palo Alto, Calif.

[21] Appl. No.: 705,873

[22] Filed: Aug. 28, 1996

[51] Int. Cl.⁶ .......................... G02B 6/26; H01L 31/0232
[52] U.S. Cl. .................. 250/214 R; 250/227.24; 437/209; 257/435; 385/25
[58] Field of Search .................. 250/216, 226, 250/214 R, 227.23, 227.24; 437/209, 211, 228, 233, 235; 257/433, 435; 385/25

[56] References Cited

U.S. PATENT DOCUMENTS

| | | | |
|---|---|---|---|
| 4,806,750 | 2/1989 | Vincent | 250/226 |
| 5,124,281 | 6/1992 | Ackerman et al. | 437/209 |
| 5,181,216 | 1/1993 | Ackerman et al. | 372/36 |
| 5,291,572 | 3/1994 | Blonder et al. | 385/94 |
| 5,307,434 | 4/1994 | Blonder et al. | 385/91 |
| 5,367,589 | 11/1994 | MacDonald et al. | 385/37 |
| 5,439,782 | 8/1995 | Haemmerle et al. | 430/321 |
| 5,694,048 | 12/1997 | Boudreau et al. | 385/25 |

*Primary Examiner*—Edward P. Westin
*Assistant Examiner*—Kevin Pyo
*Attorney, Agent, or Firm*—Thomas X. Li

[57] ABSTRACT

An integrated photonics device is described. The integrated photonics device includes a photo detector having an active area. A substrate has a side surface intersecting a top surface of the substrate at a predetermined angle. The side surface is reflective. The photo detector is bonded onto the top surface of the substrate with the active area of the photo detector facing the side surface such that light traveling parallel to the top surface of the substrate can be reflected onto the active area of the photo detector via the side surface. A method of fabricating the integrated photonics device is also described.

25 Claims, 12 Drawing Sheets

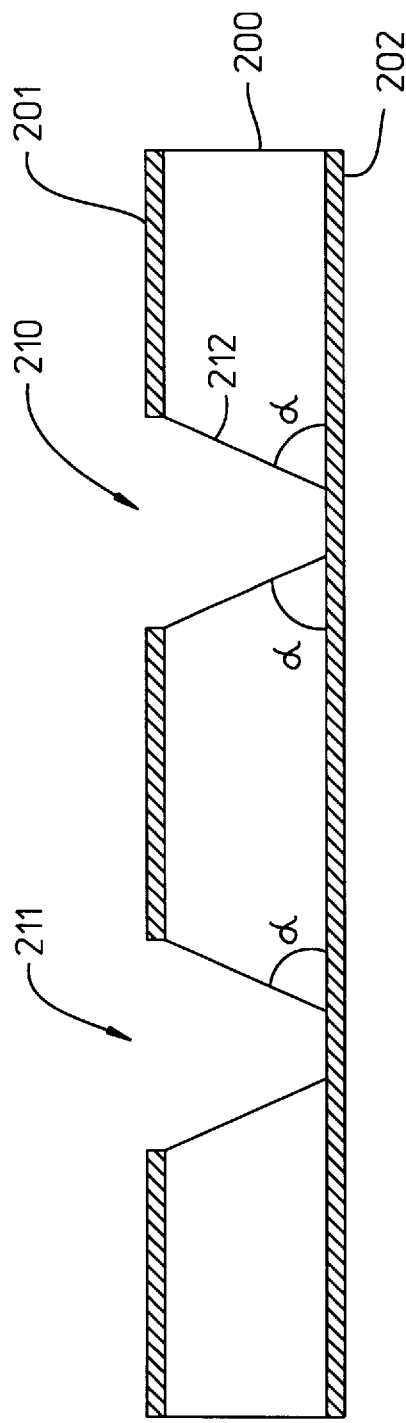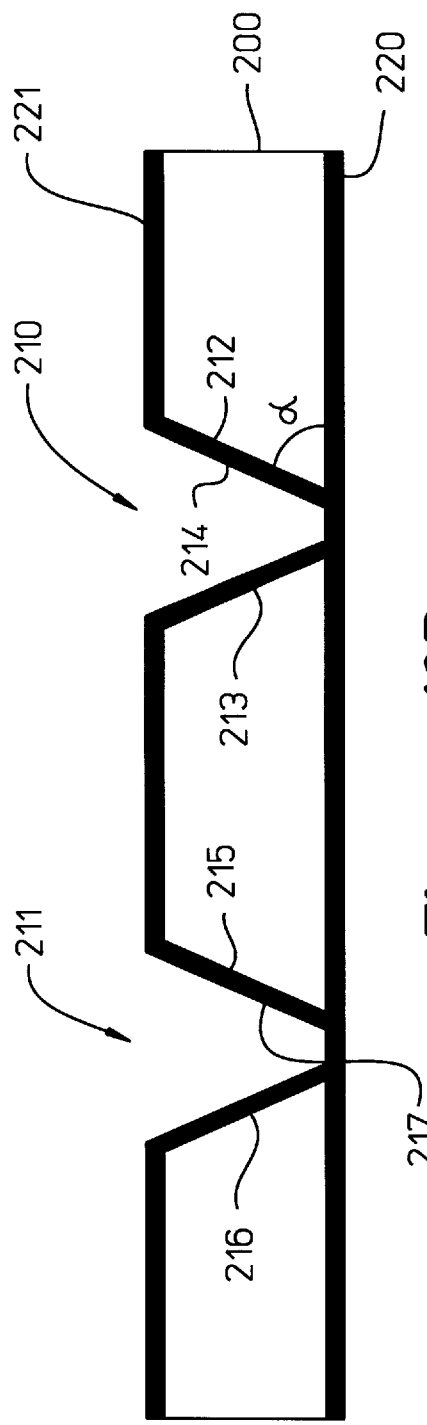

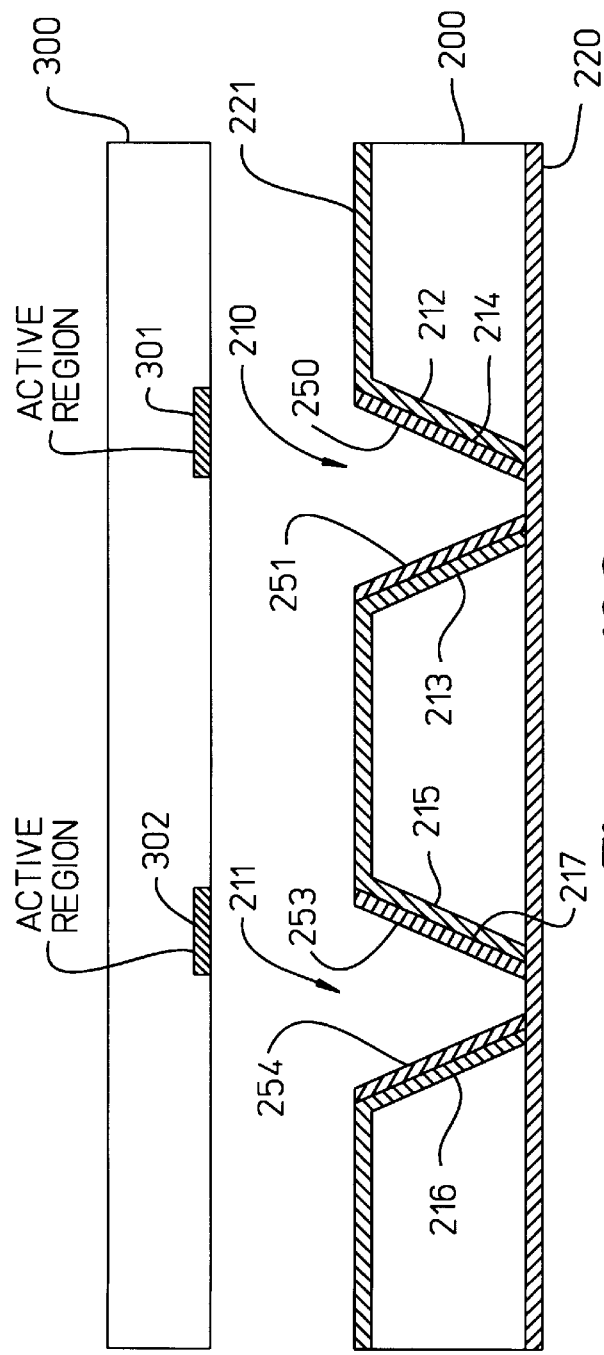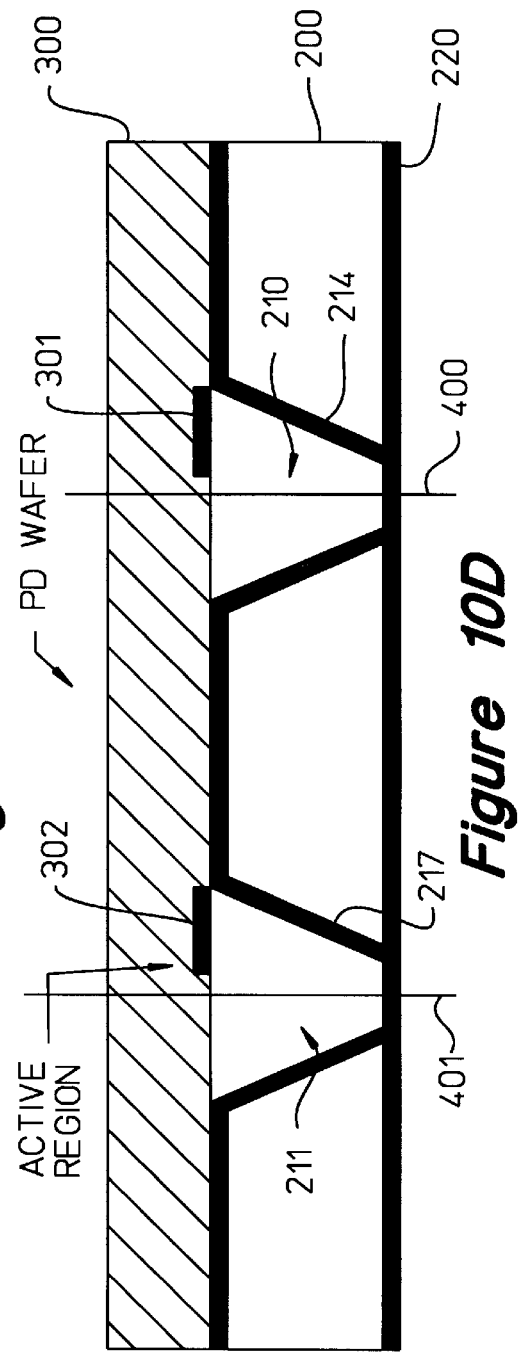

PHOTO DETECTOR WITH AN INTEGRATED MIRROR AND A METHOD OF MAKING THE SAME

BACKGROUND OF THE INVENTION

1. Field of the Invention

The present invention pertains to fiber optics or photonics modules. More particularly, this invention relates to fabricating a photo detector with an integrated mirror.

2. Description of the Related Art

Optical communications systems are widely used for carrying very large amount of information with low error rate and at low cost over great distances. For this reason, considerable development has been done on components of optical communication systems, such as photonics packages or modules. Photonics generally refers to devices that share both electronic and optical attributes. These devices can be laser devices, which generate coherent light in response to an electronic signal, and photo detectors, which generate an electronic signal in response to light.

Typically, bidirectional photonics modules use edge-emitting semiconductor lasers and surface-detecting photo detectors (see FIG. 1). As can be seen from FIG. 1, since an edge-emitting laser 11 has a relatively wide radiation angle, a lens 12 is typically inserted between the laser 11 and an optical fiber 13 to obtain high optical coupling efficiency. In addition, a lens 17 is typically inserted between the optical fiber 13 and a photo detector 15. The inserted lens 17 improves the optical coupling efficiency between the optical fiber 13 and the photo detector 15. Because the photonics module 10 is a bidirectional module, an optical filter 18 is used to reflect the light beam emitted from the optical fiber 13 to the lens 17 and to allow the light beam from the lens 12 to reach the optical fiber 13. Another photo detector 19 is used as a back facet monitor of the laser 11.

In making the photonics module 10, the laser 11, the lens 12, the optical filter 18, and the optical fiber 13 must be in precise predetermined alignment with one another. In addition, the optical fiber 13, the optical filter 18, the lens 17, and the photo detector 15 must be in precise predetermined alignment with one another. To achieve this, fixtures and/or mounts are typically needed to hold the components in place and in alignment with one another, as shown in FIG. 2.

As can be seen from FIG. 2, a fixture 21 is used to hold the lens 12 in place and in predetermined alignment with the laser 11 that is also mounted on the fixture 21. This fixture 21 is then coupled to another fixture 22 that holds the optical fiber 13 and the optical filter 18 in place. A third fixture 20 is used to hold the lens 17 in place and in alignment with the photo detector 15. The fixture 20 also mounts and secures the photo detector 15. Because the photo detector 15 is the surface-detecting photo detector (as shown in FIG. 3), the photo detector 15 is mounted on the fixture 20 perpendicular to the incoming light, as shown in FIG. 2. The fixture 20 is also coupled to the fixture 22. The alignment of the laser 11, the lenses 12 and 17, the photo detector 15, the optical filter 18, and the optical fiber 13 is achieved by the fixtures 20 through 22.

One disadvantage of such photonics modules or packages is that the fixtures are typically relatively costly to fabricate because they typically require relatively high precision. Another disadvantage is that it is typically time consuming to assemble the photonics modules using the fixtures, thus causing low throughput. In addition, time may also be needed for alignment and adjustment during assembling the photonics modules. This typically hinders mass-production of the photonics modules by operators having a moderate level of skill while maintaining the required alignment criteria. These factors typically limit the cost reduction of the photonics modules.

Another disadvantage is that it is typically difficult to mount a surface-detecting photo detector (such as the photo detector 19 shown in FIGS. 1–3) on a mounting member on which a laser (e.g., the laser 11) is mounted. This is due to the fact that the surface-detecting photo detector needs to be vertically mounted on the mounting member, with its front surface perpendicular to the top surface of the mounting member. Mounting a surface-detecting photo detector vertically on a mounting member, however, requires complex bonding and packaging steps. In addition, a costly process is required to attach a bonding wire to the photo detector that is positioned vertically with respect to the top surface of the mounting member.

SUMMARY OF THE INVENTION

The present invention is to provide a photonics module having its components mounted on a single mounting member.

The present invention is to integrate a reflector (e.g., a mirror or a wavelength-dependent reflector) and a surface-detecting photo detector together such that the surface-detecting photo detector can be mounted on the mounting member as an edge-detecting photo detector.

The present invention is to integrate a reflector (e.g., a mirror or a wavelength-dependent reflector) into a photo detector so that the number of the components mounted on the mounting member can be reduced.

The present invention is to fabricate an integrated device having a photo detector and a reflector (e.g., a mirror or a wavelength-dependent reflector) by batch processing.

Described below is an integrated photonics device. The integrated photonics device includes a photo detector having an active area. A substrate has a side surface intersecting a top surface of the substrate at a predetermined angle. The side surface is reflective. The photo detector is bonded onto the top surface of the substrate with the active area of the photo detector facing the side surface such that light traveling parallel to the top surface of the substrate can be reflected onto the active area of the photo detector via the side surface.

A method of integrating a photo detector and a reflector is described. The method includes the step of forming a substantially pyramidal cavity in a substrate. The pyramidal cavity has a reflective side wall that (1) intersects a top surface of the substrate at a predetermined angle and (2) functions as the reflector. A photo detector is attached onto the substrate with an active area of the photo detector facing the reflective side wall in the cavity. The substrate is then separated at the cavity to expose the reflective side wall to light traveling parallel to the active area of the photo detector.

Other features and advantages of the present invention will become apparent from the following detailed description, taken in conjunction with the accompanying drawings, illustrating by way of example the principles of the invention.

BRIEF DESCRIPTION OF THE DRAWINGS

FIGS. 10A through 10E show different fabrication stages of the integrated photo detector of FIG. 7–9.

DETAILED DESCRIPTION OF THE INVENTION

Figure 1:
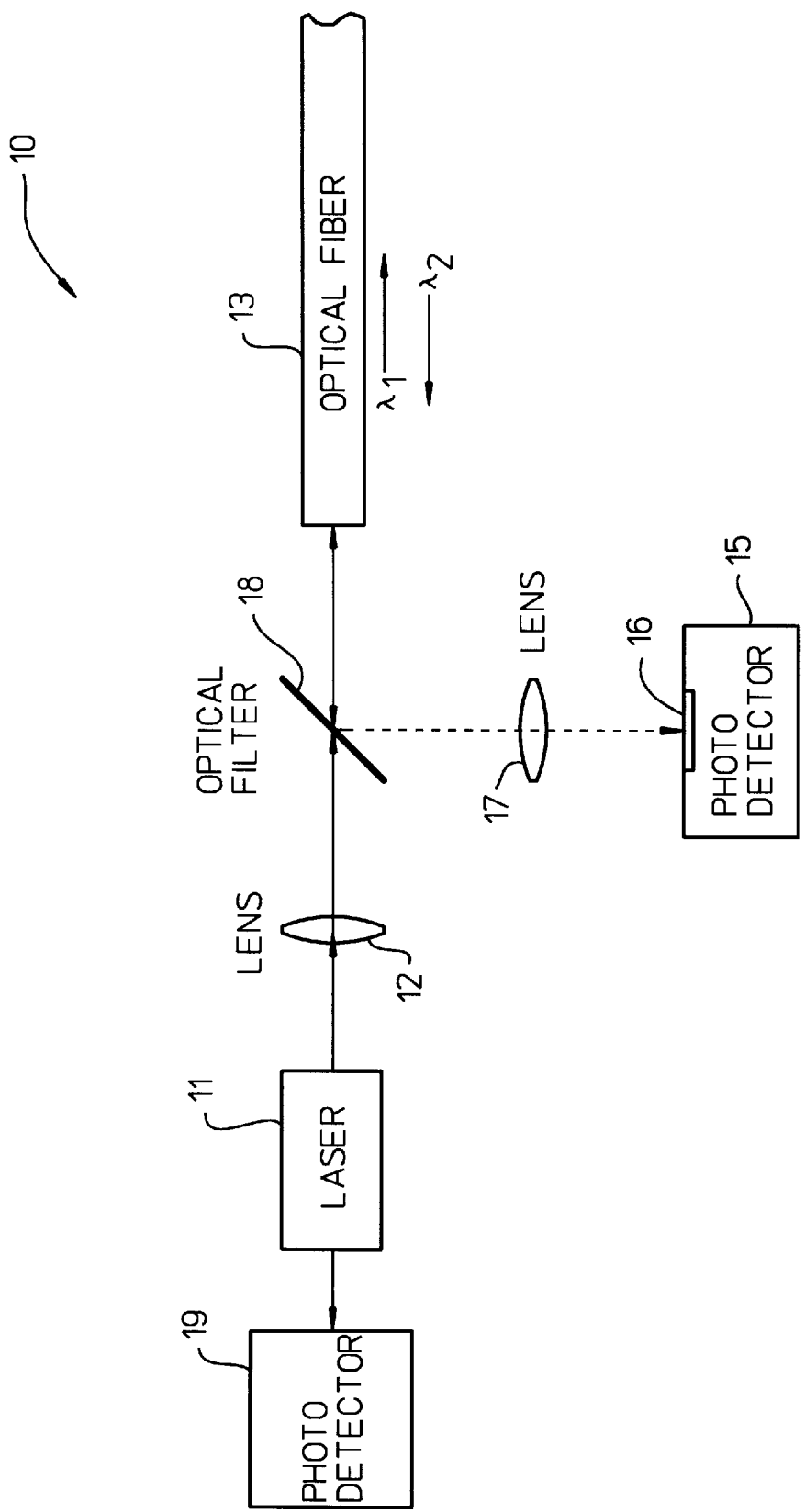
FIG. 1 schematically shows a prior art bidirectional photonics module.
Figure 2:
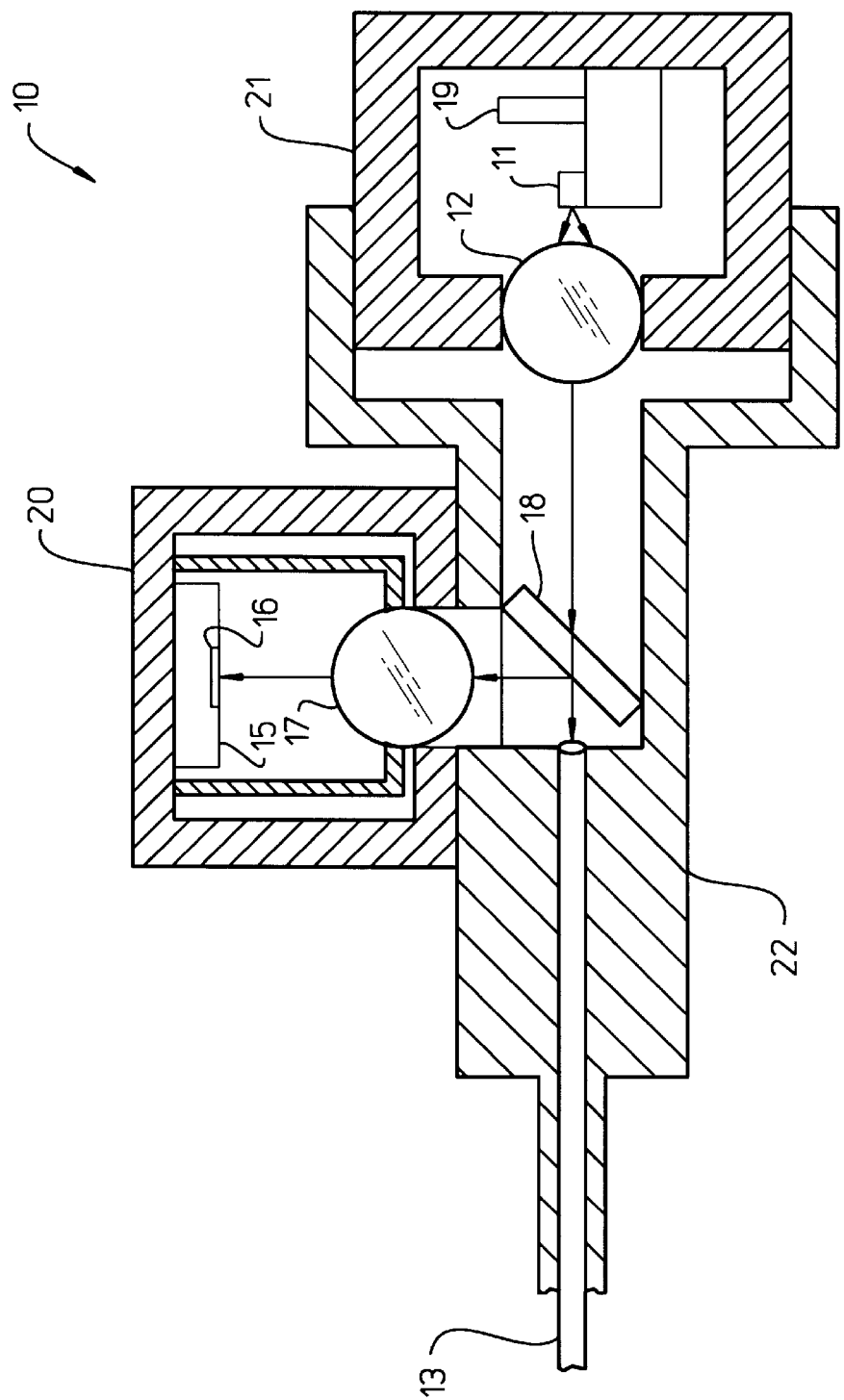
FIG. 2 is a side cross sectional view showing the package of the bidirectional photonics module of FIG. 1.
Figure 3:
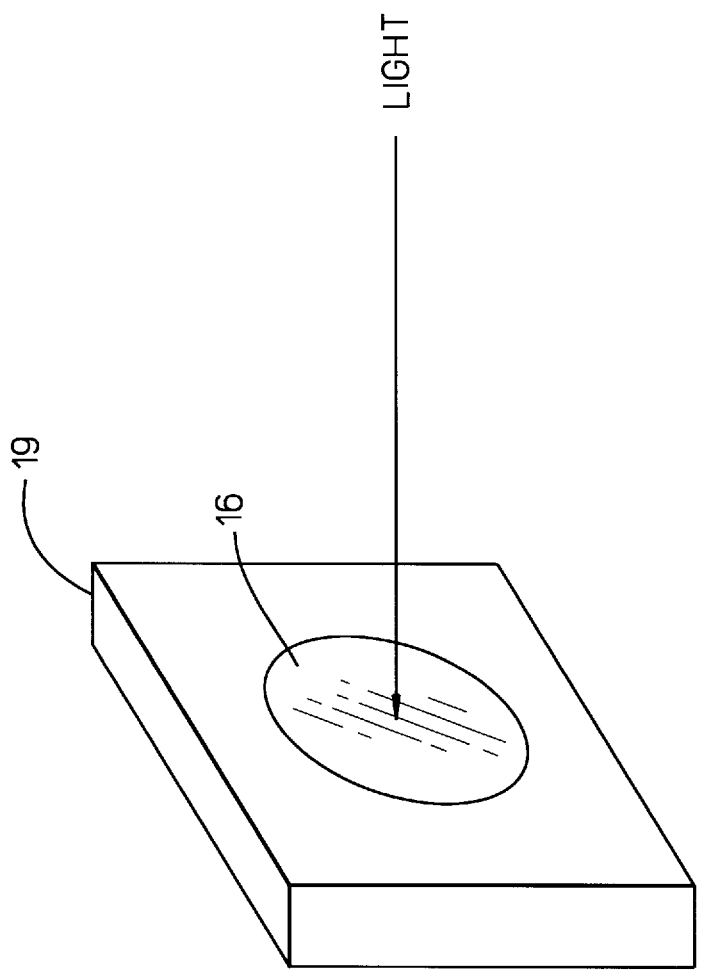
FIG. 3 shows a prior art surface-detecting photo detector used in the bidirectional photo module of FIGS. 1–2.
Figure 4:
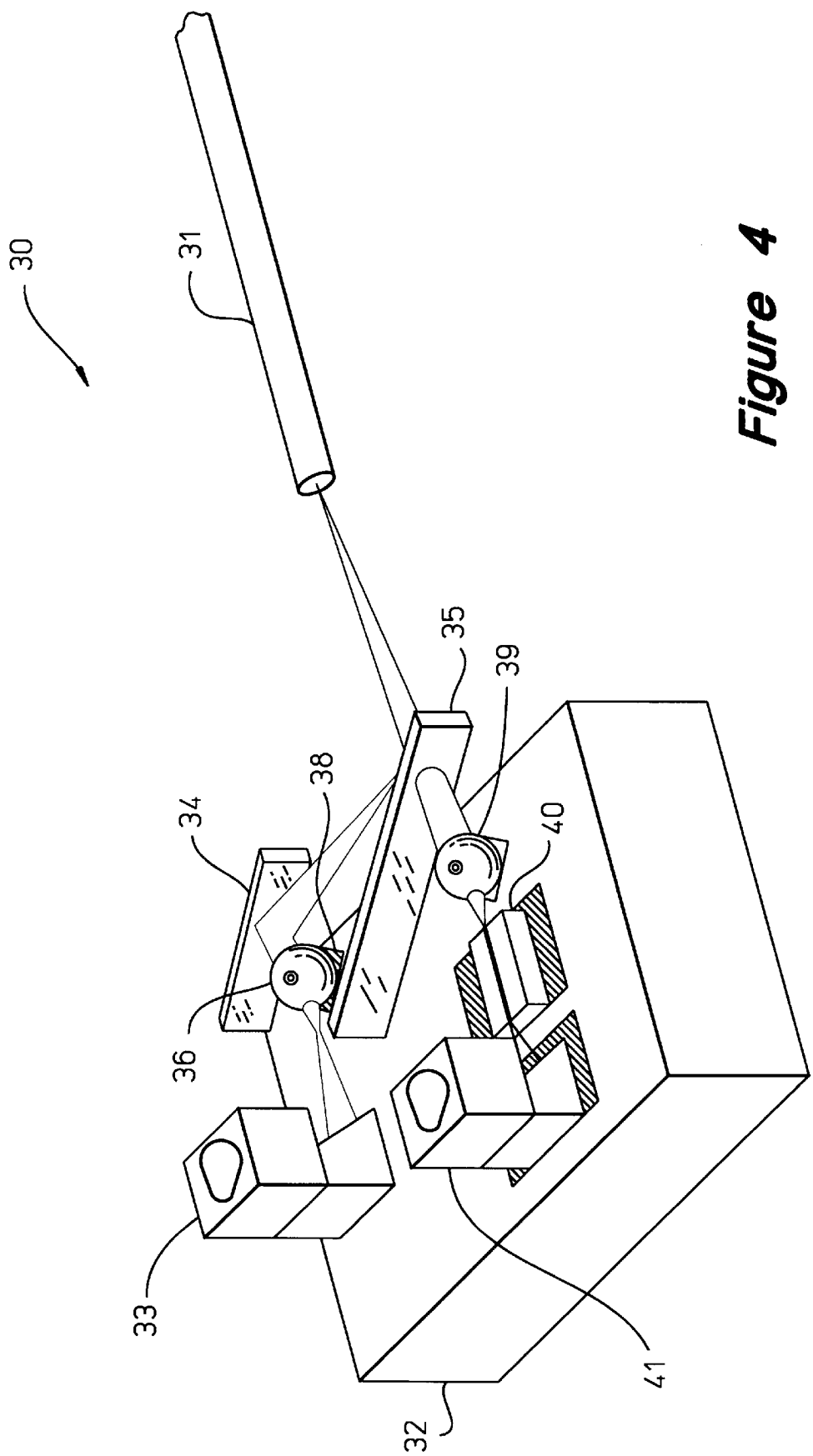
FIG. 4 is perspective view of a bidirectional photonics module having integrate photo detectors fabricated in accordance with one embodiment of the present invention.
Figure 5:
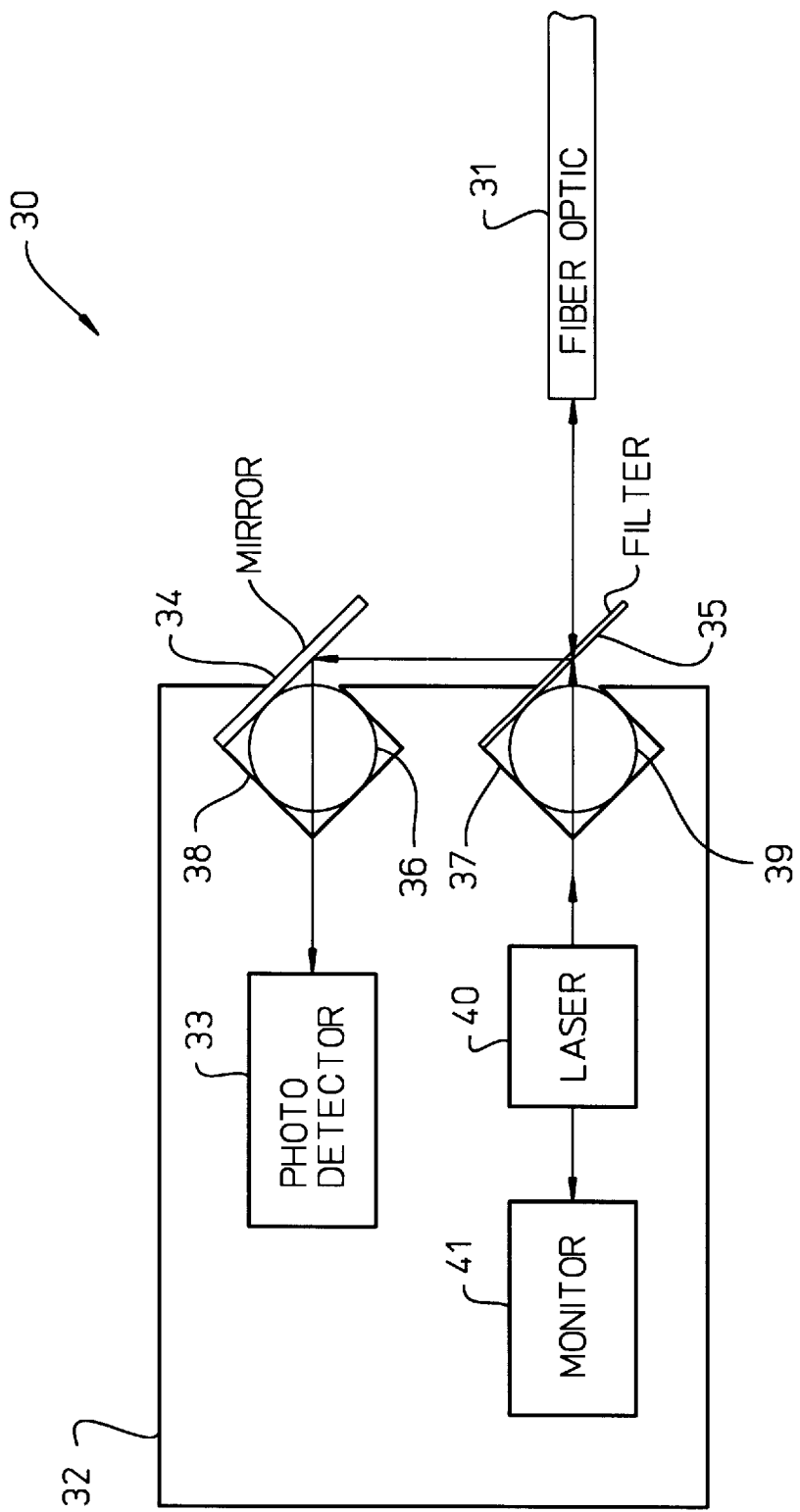
FIG. 5 is a view of the bidirectional photonics module of FIG. 4.
Figure 7:
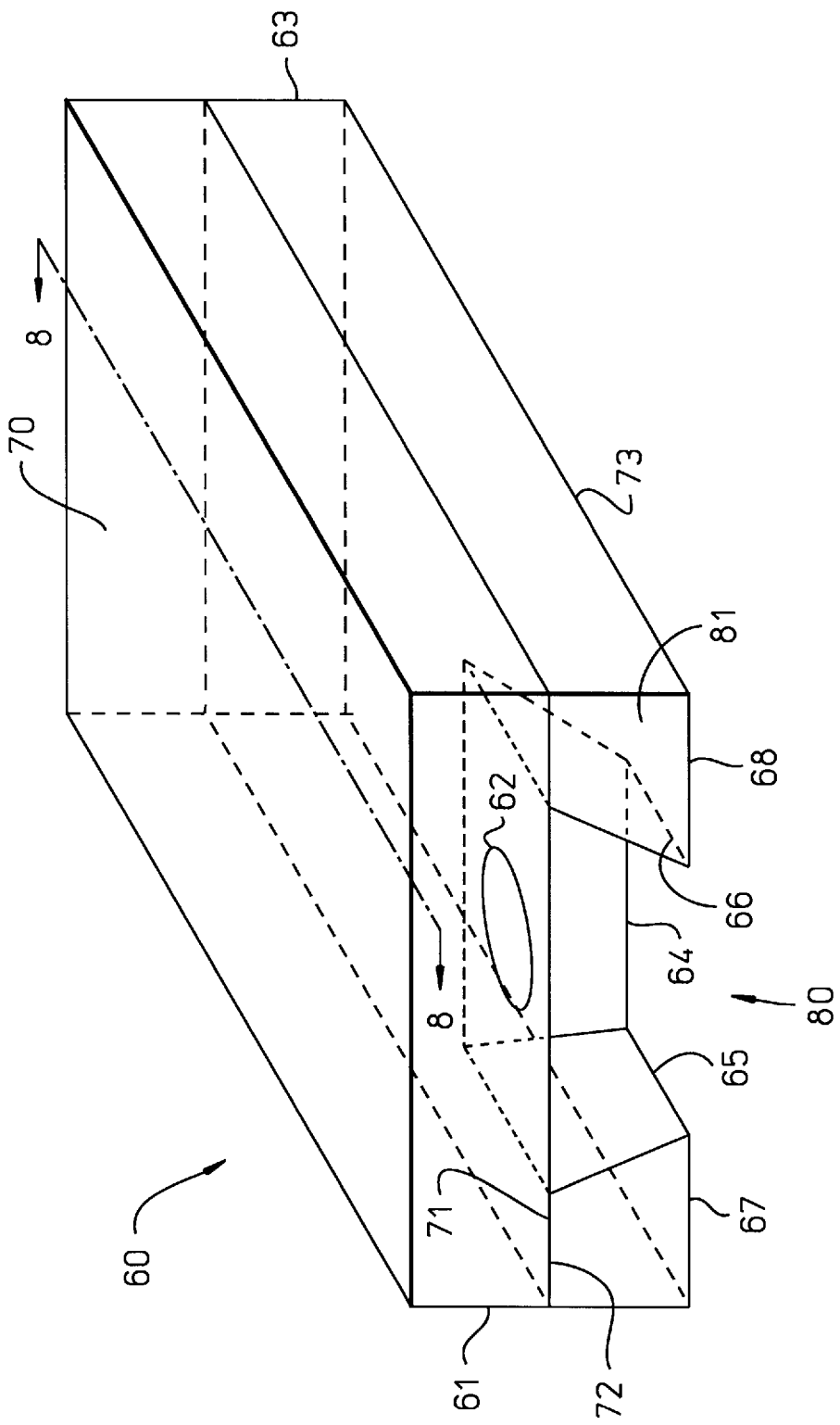
FIG. 7 is a perspective view of the integrated photo detector of FIG. 6.
Figure 8:
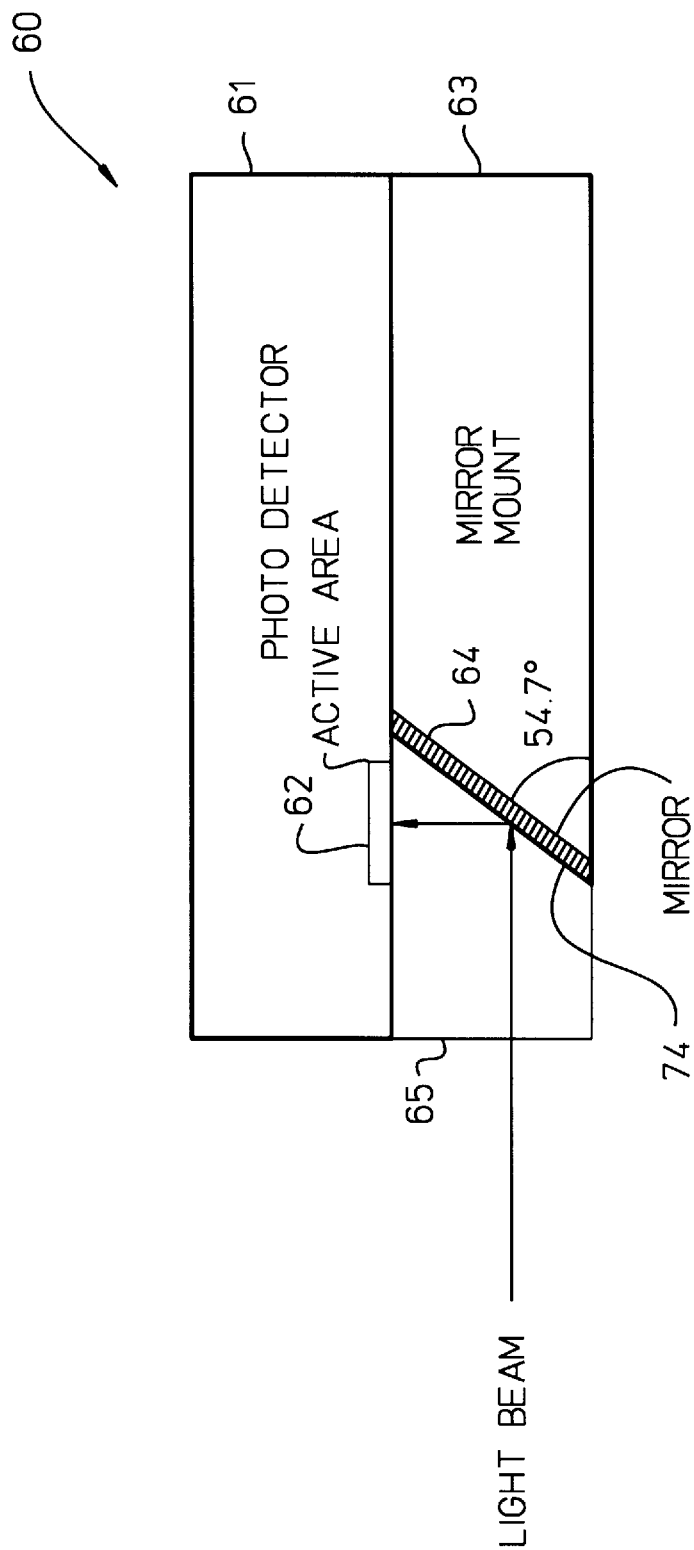
FIG. 8 is a side cross sectional view of the integrated photo detector of FIG. 7.
Figure 9:
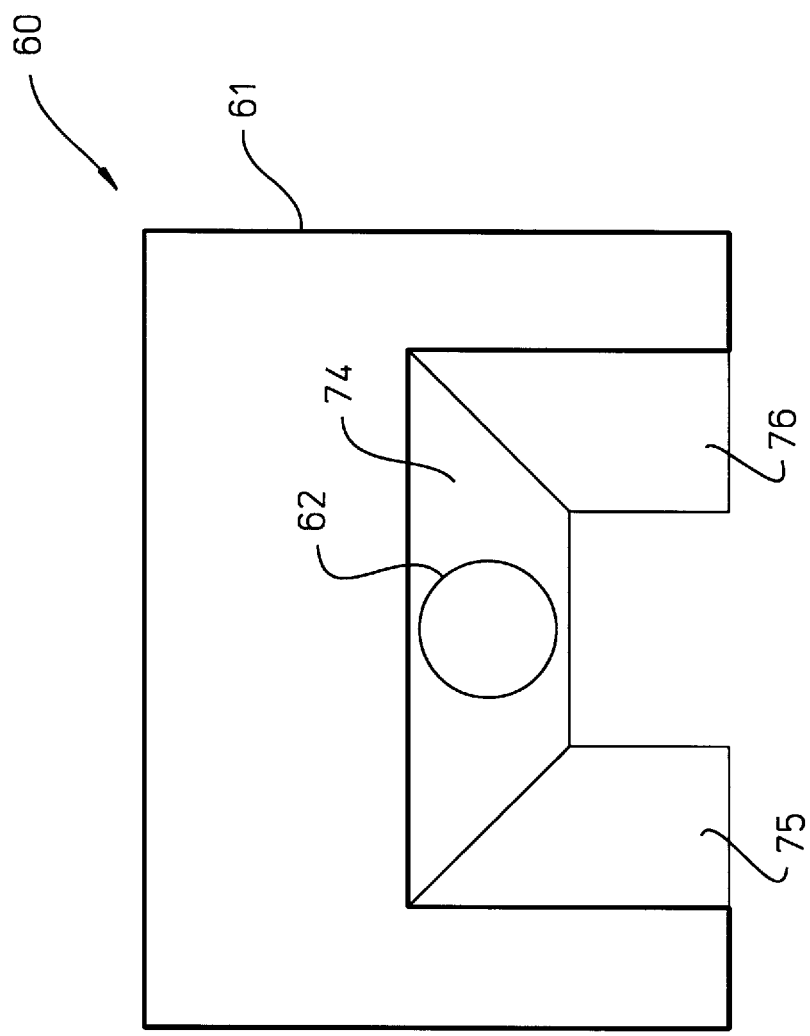
FIG. 9 is a view of the integrated photo detector of FIG. 7.

FIG. 4 is a perspective view of a bidirectional photonics module 30 having integrated photo detectors 33 and 41 that implement one embodiment of the present invention. Alternatively, the photonics module 30 may not be a bidirectional photonics module. In this case, more or fewer photo detectors than photo detectors 33 and 41 can be included in the photonics module 30. FIG. 4 partly shows the integrated photo detectors 33 and 41. FIG. 5 is a top view of the photonics module 30, also showing the photo detectors 33 and 41. The complete structure of each of the integrated photo detector 33 and 41 is shown in FIGS. 7 through 9, which will be described in more detail below.

As can be seen from FIGS. 4 and 5, the photonics module 30 includes a laser 40, an optical filter 35, a mirror 34, and spherical lens 36 and 39, in addition to the integrated photo detectors 33 and 41. The photonics module 30 is then optically coupled to an optic fiber 31. The integrated photo detector 41 functions as a back facet monitor of the laser 40. All of the components except the optical fiber 31 of the photonics module 30 are mounted on a mounting member 32 of the photonics module 30.

In one embodiment, the mounting member 32 is made of a semiconductor material. Using semiconductor material for the mounting member 32 allows the mounting member 32 to be processed by a photo-lithographic masking and etching process for mounting the components of the photonics module 30. As is known, the photo-lithographic masking and etching process is widely used in fabricating semiconductor integrated circuits with a great deal of accuracy. This thus allows the mounting member 32 to be processed with a great deal of accuracy.

In addition, using semiconductor material for the mounting member 32 allows the size of the photonics module 30 to be substantially reduced because the components of the photonics module 30 can now be mounted on the single mounting member 32. Moreover, a large number of mounting members identical to the mounting member 32 can be made from a single silicon wafer using batch processing.

In one embodiment, the mounting member 32 is made of a <100> crystalline silicon material. Alternatively, other crystalline semiconductor materials can be used to form the mounting member 32. Moreover, the mounting member 32 can be made of materials other than the semiconductor material.

When the mounting member 32 is a <100> silicon, the mounting member 32 can be anisotropically etched using, for example, a KOH (i.e., potassium hydroxide) etchant to form a cavity. The speed of the anisotropic etching can be 1000 to 1 under some condition. This means that the vertical etching rate into the silicon mounting member 32 is 1000 times faster than the speed of etching towards the <111> crystallographic planes of the silicon mounting member 32. In other words, the <111> crystallographic planes serve as etch stops. The anisotropic etching causes the etched side walls of the cavity of the mounting member 32 to lie on the <111> crystallographic planes of the mounting member 32. As is known, the <111> crystallographic planes intersect the <100> crystallographic planes of the mounting member 32 at approximately 54.7°. When the top and bottom surfaces of the mounting member 32 lie on the <100> planes, the side walls of the cavity intersect the top and bottom surfaces of the mounting member 32 at approximately 54.7°. Alternatively, the side walls of the cavity can intersect the top and bottom surfaces of the mounting member 32 at an angle greater or less than 54.7°. For example, the mounting member 32 can be made (e.g., polished) such that its surfaces do not lie on the <100> planes of the mounting member 32. In this case, the surfaces of the mounting member 32 are at a predetermined angle β with the <100> planes. This causes the <111> crystallographic planes of the mounting member 32 to intersect the top and bottom surfaces of the mounting member 32 at an angle that is equal to 54.7°±β.

As can be seen from FIGS. 4 and 5, the laser 40 is an edge-emitting laser and is bonded onto the top surface of the mounting member 32. Each of the spherical lenses 36 and 39 is seated in one of pyramidal cavities 37 and 38. The pyramidal cavities 37–38 are etched such that their respective side walls lie on the <111> crystallographic planes of the mounting member 32. The optical filter 35 and the mirror 34 are bonded onto the top surface of the mounting member 32.

As described above, it is typically difficult to directly mount a surface-detecting photo detector on the mounting member 32. This is due to the fact that the surface-detecting photo detector needs to be vertically mounted on the mounting member 32, with its front surface perpendicular to the top surface of the mounting member 32. As can be seen from FIG. 4, the light beam from the laser 40 or the spherical lens 36 travels parallel to the top surface of the mounting member 32. Therefore, it is desirable for a surface-detecting photo detector to be mounted or positioned horizontally on the mounting member 32.

Figure 6:
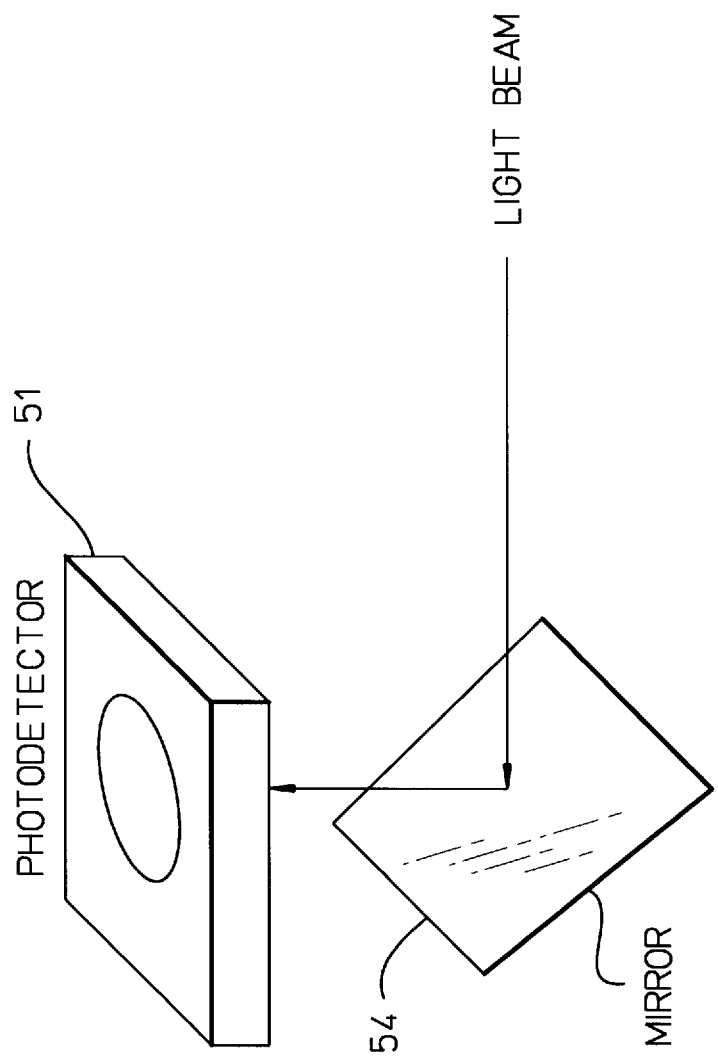
FIG. 6 schematically illustrates the integrated photo detector of FIG. 4.

To accomplish this, arrangement has to be made to allow the surface-detecting photo detector to function as an edge-detecting photo detector in order to receive the incoming light beam traveling parallel to the front surface of the photo detector. This can be realized by employing a mirror or reflector to deflect the incoming light beam, as shown in FIG. 6. As can be seen from FIG. 6, a surface-detecting photo detector 51 is parallel to the incoming light beam. A mirror 54 is inserted in the optical path to deflect the incoming light beam to the surface-detecting photo detector 51. The mirror 54 is positioned at angle of approximately 45° or 54° with respect to the optical axis of the incoming light beam such that the deflected light beam is substantially perpendicular to the front surface of the photo detector 51. This thus causes the surface-detecting photo detector 51 to function as an edge-detecting detector.

However, if the mirror 54 and the photo detector 51 are directly mounted on the mounting member 32 (FIGS. 4–5), extra frame support is required to hold and align the mirror 54 with respect to the photo detector 51. In addition, the mirror 54 is an additional optical element to be mounted and aligned on the mounting member 32. This typically increases the cost of packaging a photonics module with such discrete optical elements.

Referring to FIGS. 4–5, in accordance with one embodiment of the present invention, the mirror 54 is integrated into the surface-detecting photo detector 51 to form an integrated photo detector that is identical to each of the integrated photo detectors 33 and 41 (FIGS. 4–5). This simplifies the mounting of the integrated photo detectors 33 and 41 on the mounting member 32 and reduces the packaging cost of the photonics module 30. In this case, each of the integrated photo detectors 33 and 41 functions as an edge-detecting photo detector. In addition, only one alignment is required to mount each of the integrated photo detectors 33 and 41 on the mounting member 32 and each of the integrated photo detectors 33 and 41 does not require any alignment of the mirror with the photo detector during mounting. Moreover, the integration allows each of the integrated photo detectors 33 and 41 to be fabricated by batch processing such that the cost associated with the integration is reduced.

In accordance with another embodiment of the present invention, each of the integrated photo detectors 33 and 41 may integrate an optical component other than a mirror into the photo detector. For example, the integrated optical component may be a wavelength-dependent reflector (i.e., an optical filter).

In one embodiment, each of the integrated photo detectors 33 and 41 is fabricated using semiconductor material. This means that the mirror in each of the integrated photo detectors 33 and 41 can also be fabricated using semiconductor material. Alternatively, the mirror in each of the integrated photo detectors 33 and 41 can be fabricated by other types of materials. For example, ceramic materials and/or metals can be used to make the mirror.

Using semiconductor material to make and integrate a mirror into a surface-detecting semiconductor photo detector allows the use of the photo-lithographic masking and etching that is widely used in fabricating semiconductor integrated circuits. This allows the mirror to be aligned with the photo detector with a great deal of accuracy during fabrication. In addition, using semiconductor material and photo-lithographic process allows a large number of the integrated photo detectors 33 and 41 to be made from a single bonded silicon wafer by batch processing, thus reducing the cost associated with the integration. This also allows each of the integrated photo detectors 33 and 41 to be small. The structure and the method of fabricating each of the integrated photo detectors 33 and 41 will be described in more detail below, in conjunction with FIGS. 7 through 10E.

FIG. 7 shows a perspective view of an integrated photo detector 60 which represents either of the integrated photo detectors 33 and 41 of FIGS. 4–5. FIG. 8 shows the side cross-sectional view of the integrated photo detector 60 along line 8—8 of FIG. 7. FIG. 9 is a top view of the integrated photo detector 60. As can be seen from FIGS. 7–9, the integrated photo detector 60 includes a surface-detecting photo detector 61 and a mirror mount 63. The photo detector 61 includes an active area 62. The photo detector 61 is a semiconductor photo detector. This means that the active area 62 is formed on a semiconductor substrate. Each of the front and back surfaces 70 and 71 of the photo detector 61 is coated with a metal layer (not shown) that serves as an electrode of the photo detector 61.

The mirror mount 63 can be made of semiconductor or other types of materials. In one embodiment, the material used to make the mirror mount 63 is a <100> mono-crystalline silicon material. In a further embodiment, the <100> mono-crystalline silicon material is an N$^+$<100> mono-crystalline silicon material. In other embodiments, the mirror mount 63 can be made of ceramic materials or metals. The mirror mount 63 described below uses the <100> mono-crystalline silicon material as an example.

In one embodiment, the top and bottom surfaces of the mirror mount 63 lie on the <100> crystallographic planes of the <100> silicon mirror mount 63. In other embodiments, the top and bottom surfaces of the mirror mount 63 do not lie on the <100> planes and intersect the <100> planes at a predetermined angle. The mirror mount 63 includes an opening 80 in one side 81 of the mirror mount 63. The opening 80 is in a dovetail shape and is defined by three sloping side walls 64 through 66. Each of the side walls 64–66 lie on a <111> crystallographic plane of the crystalline mirror mount 63. When the top and bottom surfaces of the mirror mount 63 lie on the <100> planes, each of the side walls 64–66 intersects the top and bottom surfaces of the mirror mount 63 at an angle of approximately 54.7°, as shown in FIG. 8.

By causing the side walls 64–66 to lie on the <111> planes, the side walls 64–66 are made very smooth and exhibit a mirror-like effect. This means that each of the side walls 64–66 is in fact a reflective surface and can function as a reflector or a mirror.

In order to increase the reflectivity of the side walls 64–66, a highly reflective metal layer (e.g., the metal layers 74–76 of FIGS. 8–9) is applied to each of the side walls 64–66. When the metal layers 74–76 are formed on the side walls 64–66, each of the metal layers 74–76 serves as a mirror or reflector. When each of the side walls 64–66 is not applied with a metal layer, each of the side walls 64–66 functions as a mirror or reflector.

In addition, a metal layer (not shown in FIGS. 7–9) is also applied to each of the top and bottom surfaces 72–73 of the mirror mount 63. This allows the metal layer on the bottom surface 73 of the mirror mount 63 to contact the metal layer on the top surface 72 of the mirror mount 63 via the metal layers 74–76. This connection allows the metal layer on the bottom surface 73 of the mirror mount 63 to function as one of the electrodes of the photo detector 61 when the photo detector 61 is attached to the mirror mount 63.

In one embodiment, the highly reflective metal layer is a gold layer. In another embodiment, the highly reflective metal layer is an aluminum layer. Alternatively, other metals can be used to form the highly reflective metal layer.

Alternatively, the side walls 64–66 may not be applied with a metal layer. Instead, one or more dielectric layers are applied onto one or all of the side walls 64–66 to form a wavelength-dependent reflector (i.e., an optical filter). In addition, a dielectric layer can also be applied to one or all of the metal layers 74–76 to protect the metal layers 74–76 from being degraded by any bonding material that may overflow onto the metal layers 74–76.

The photo detector 61 is attached to the mirror mount 63. The attachment is such that the active area 62 of the photo detector 61 faces the opening 80 of the mirror mount 63. In this case, the active area 62 of the photo detector 61 is aligned with the mirror 74 in the opening 80 at approximately 54.7°, as can be seen from FIG. 8. In addition, the portions 67 and 68 of the mirror mount 63 behind the side walls 65 and 66 function as two shoulders to support photo detector 61 around the opening 80. The three mirrors 74–76 underneath the active area 62 of the photo detector 61 improve the light collecting efficiency when the incoming light beam has a relatively large divergence angle. In addition, the opening 80 underneath the active area 62 also serves as a shield against the unwanted stray light that may otherwise reach the active area 62 of the photo detector 61, reducing noise level of the photo detector 61.

In one embodiment, the photo detector 61 is bonded to the mirror mount 63 using conductive epoxy or other conductive adhesive material. In another embodiment, solder is used to bond the photo detector 61 to the mirror mount 63. Alternatively, other bonding mechanisms can be used to attach the photo detector 61 to the mirror mount 63.

FIGS. 10A through 10E show the process of fabricating the integrated photo detector 60 of FIGS. 7–9 using batch processing. As can be seen from FIG. 10A, a <100> monocrystalline silicon substrate 200 is provided. The top and bottom surfaces of the substrate 200 are <100> crystallographic surfaces. In one embodiment, the silicon substrate 200 is an N+ silicon substrate. Alternatively, other materials can be used for the substrate 200. For example, ceramic materials or metals can be used to make the substrate 200.

The substrate 200 then undergoes photo-lithographic masking and anisotropic etching to form a number of substantially pyramidal cavities in the substrate 200, one for each photo detector from a photo detector wafer 300 (shown in FIGS. 10C and 10D) to be attached to the substrate 200. FIG. 10A only shows pyramidal cavities 210 and 211 formed in the substrate 200. In practice, many more pyramidal cavities are formed in the substrate 200.

As can be seen from FIG. 10A, to form the pyramidal cavities (e.g., the pyramidal cavities 210 and 211) in the substrate 200, a mask layer 201 is deposited on the top surface of the substrate 200, defining a number of openings at predetermined spacing distances. The top surface of the substrate 200 is exposed at each of the openings. A mask layer 202 is deposited on the bottom surface of the substrate 200.

In one embodiment, each of the openings is substantially rectangular. In another embodiment, each of the openings is square.

In one embodiment, each of the mask layers 201–202 is a $Si_3N_4$ mask layer. Alternatively, other types of known mask layers can be used.

The substrate 200 is then anisotropically etched through the openings using, for example, the KOH (i.e., potassium hydroxide) etchant to form the pyramidal cavities (e.g., pyramidal cavities 210 and 211). The anisotropic etching causes the side walls of each of the pyramidal cavities formed in the substrate 200 to lie on the <111> crystallographic planes of the substrate 200 which intersect the top and bottom surfaces of the substrate 200 at approximately 54.7°. As described above, the <111> crystallographic planes of the substrate 200 intersect the <100> surfaces of the substrate 200 at approximately 54.7°. In addition, by causing the side walls to lie on the <111> crystallographic planes of the substrate 200, the side walls are made very smooth and exhibit a mirror-like effect.

The thickness of the substrate 200 is chosen such that at least one of the side walls of each of the cavities has enough surface area for forming a mirror. In one embodiment, the thickness of the substrate 200 is approximately 200 microns. Alternatively, the thickness of the substrate 200 can be greater or less than 200 microns.

In one embodiment and as shown in FIGS. 10A–10E, each of the pyramidal cavities formed in the substrate 200 runs through the substrate 200. In another embodiment, each of the pyramidal cavities formed in the substrate 200 does not run through the substrate 200.

The mask layers 201 and 202 are then removed from the substrate 200 and a metal layer 221 and a metal layer 220 are applied onto the top and bottom surfaces of the substrate 200, respectively, as shown in FIG. 10B. The metal layer 221 is also applied to the side walls of each of the pyramidal cavities. For example, the metal layer 221 is applied to each of the side walls 212 and 213 of the pyramidal cavity 210 and each of the side walls 215 and 216 of the pyramidal cavity 211.

The metal layer 221 is a highly reflective metal layer. In one embodiment, the metal layer 221 is a gold layer. In another embodiment, the metal layer 221 is an aluminum layer. Alternatively, other highly reflective metals can be used.

The metal layer 221 applied on the side walls of each of the cavities increases the refractivity of the mirror-like side walls of each of the cavities from approximately 30% to a much higher value. For example, a gold layer can increase the reflectivity to approximately 98%. This causes a mirror (e.g., the mirror 214 or 217) to be formed on each side wall of each cavity. Because each side wall of each cavity lies on the <111> crystallographic plane, the mirror (e.g., the mirror 214 or 217) formed on each side wall is therefore fixed at the 54.7° with respect to the top and bottom surfaces of the substrate 200.

Alternatively, the metal layer 221 does not extend into the side walls of each of the pyramidal cavities. In this case, the mirror (e.g., the mirror 214 or 217) are simply formed by the mirror like side walls (e.g., the side walls 215 and 212). This is because each of the side walls of each cavity has a mirror-like surface and can function as a mirror or reflector.

In addition, one or more dielectric layers can be directly applied to the side walls (e.g., the side walls 212 and 215) of each cavity such that wavelength-dependent reflectors (i.e., optical filters) are formed on the side walls of the cavities.

Referring to FIG. 10C, a dielectric coating (e.g., the dielectric coating 250 and 253) may be selectively applied on the mirrors (e.g., the mirrors 214 and 217) in each cavity. For example, the dielectric coating 250 is applied on the mirror 214 and the dielectric coating 253 is applied on the mirror 217. The purpose of applying the dielectric coatings is to prevent the mirror from being degraded by any bonding material overflown to the mirror surfaces. Alternatively, the dielectric coating may be omitted. The dielectric coating can be any known suitable dielectric coating and the application method can be any known dielectric coating application method.

The substrate 200 is then bonded to the photo detector wafer 300. As can be seen from FIG. 10C, the wafer 300 is a wafer on which a number of semiconductor surface-detecting photo detectors (represented by their respective active areas such as active areas 301 and 302) are fabricated at a predetermined spacing distance. The predetermined spacing distance corresponds to the predetermined spacing distance for the cavities formed on the substrate 200. This thus allows the photo detectors of the photo detector wafer 300 to be aligned to the mirrors in the cavities of the substrate 200 when the wafer 300 is bonded to the substrate 200. The fabrication of the photo detector wafer 300 is known in the art and will not be described in detail below.

In one embodiment, the photo detector wafer 300 is bonded to the substrate 200 using conductive epoxy or other types of adhesive materials. In this case, the epoxy is applied to photo detector wafer 300 using centrifugal force. In another embodiment, the photo detector wafer 300 is bonded to the substrate 200 using solder or other metal bonds. In this case the solder bonds can be deposited on the photo detector wafer 300 and/or the substrate 200. Alternatively, other types of bonding methods or materials can be used to bond the photo detector wafer 300 to the substrate 200. For example, the wafer 300 can be bonded to the substrate 200 at a number of points using solder bonds. Then epoxy can be injected into the gaps created by the solder bonds between the wafer 300 and the substrate 200 to further enhance the solder bonds.

Figure 10E:
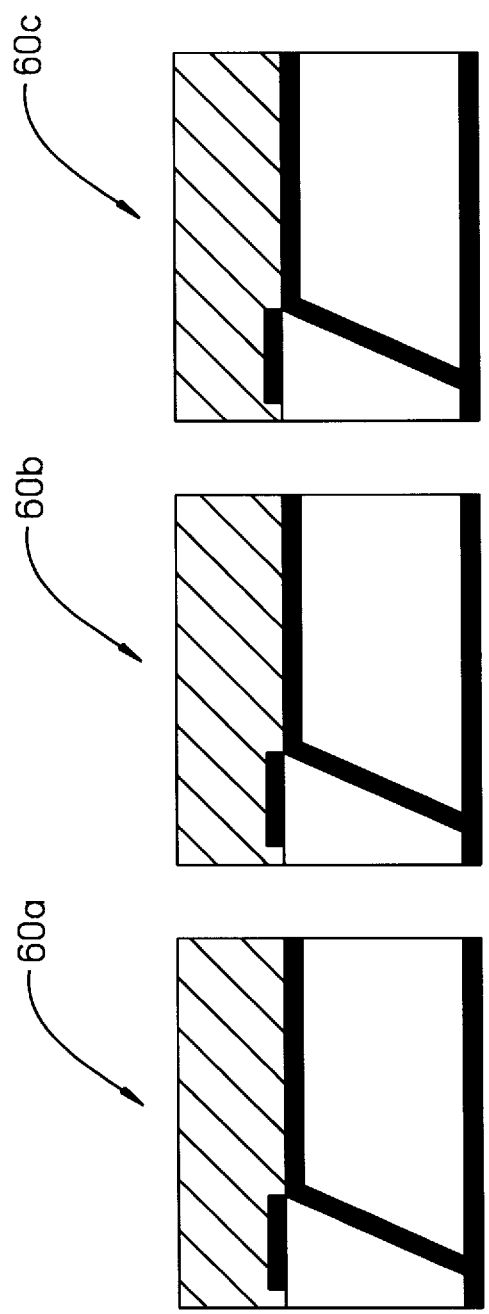

As can be seen from FIG. 10D, when the photo detector wafer 300 is bonded to the substrate 200, the active area (e.g., the active area 301 or 302) is aligned to the 54.7° mirror (e.g., the mirror 214 or 217) to form the integrated photo detector 60 of FIGS. 7–9. The bonded wafer 300 and substrate 200 is then separated by dicing saw cuts along the saw cut lines (e.g., the saw cut lines 400 and 401) or by cleaving to produce many identical units (e.g., units 60a–60c of FIG. 10E) of the integrated photo detector 60 (see FIGS. 7–9). As can be seen from FIG. 10D, the saw cut lines are made outside the active area of each of the photo detectors in the photo detector wafer 300. Each of the separated units includes an integrated mirror and a surface-detecting photo detector (as shown in FIG. 10E). In addition, bonding the photo detector wafer 300 to the substrate 200 also connects one of the electrodes of each of the photo detectors in the wafer 300 to the metal layer 220. This makes it easy for the integrated photo detector 60 to be mounted on the mounting member 32 of FIGS. 4–5. This also makes it easy to electrical connect the integrated photo detector 60 with other devices of the photonics module 30 of FIGS. 4–5.

In the foregoing specification, the invention has been described with reference to specific embodiments thereof. It will, however, be evident to those skilled in the art that various modifications and changes may be made thereto without departing from the broader spirit and scope of the invention. The specification and drawings are, accordingly, to be regarded in an illustrative rather than a restrictive sense.

What is claimed is:

1. A method of integrating a photo detector and a reflector, comprising the steps of:
   (A) forming a substantially pyramidal cavity in a substrate, the pyramidal cavity having a reflective side wall that (1) intersects a top surface of the substrate at a predetermined angle and (2) functions as the reflector;
   (B) attaching a photo detector onto the substrate with an active area of the photo detector facing the reflective side wall in the cavity;
   (C) separating the substrate at the cavity to expose the reflective side wall to light traveling parallel to the active area of the photo detector such that the photo detector and the reflector are integrated into a discrete device wherein the substrate only supports the photo detector after being separated.

2. The method of claim 1, further comprising the step of applying a highly reflective metal layer on the reflective side wall prior to the step (B).

3. The method of claim 2, further comprising the step of applying metal layers on the top surface and a bottom surface of the substrate such that the metal layers are electrically connected to the highly reflective metal layer on the reflective side wall prior to the step (B).

4. The method of claim 2, further comprising the step of applying a dielectric coating onto the highly reflective metal layer.

5. The method of claim 1, further comprising the step of applying dielectric layers on the reflective side wall to turn the reflector into a wavelength-dependent reflector.

6. The method of claim 1, wherein the substrate is a crystalline silicon substrate and the step (A) further comprises the step of anisotropically etching the substrate to form the pyramidal cavity such that the reflective side wall is defined by the crystallographic planes of the substrate.

7. The method of claim 1, wherein the predetermined angle is approximately 54.7°.

8. The method of claim 1, wherein the step (B) comprises the step of bonding the photo detector onto the substrate.

9. The method of claim 8, wherein the photo detector is bonded onto the substrate by conductive epoxy, solder, or a combination of solder and epoxy.

10. The method of claim 1, wherein the pyramidal cavity has a substantially rectangular opening and extends from the top surface of the substrate to a bottom surface of the substrate.

11. A method of fabricating a plurality of integrated devices, each having a photo detector and a reflector, comprising the steps of:
    (A) forming a plurality of substantially pyramidal cavities in a substrate, each of the cavities having a reflective side wall that (1) intersects a top surface of the substrate at a predetermined angle and (2) functions as the reflector;
    (B) attaching a photo detector wafer having a plurality of photo detectors onto the substrate with an active area of each of the photo detectors facing the reflective side wall in one of the cavities;
    (C) separating the substrate at each of the cavities to expose the reflective side wall of each of the cavities to light traveling parallel to the active area of each of the photo detectors to obtain the plurality of the integrated discrete devices by batch processing, wherein the substrate only supports the photo detectors after being separated.

12. The method of claim 11, further comprising the step of applying a highly reflective metal layer on the reflective side wall of each of the cavities prior to the step (B).

13. The method of claim 12, further comprising the step of applying metal layers on the top surface and a bottom surface of the substrate such that the metal layers are electrically connected to the highly reflective metal layer on the reflective side wall of each of the cavities prior to the step (B).

14. The method of claim 12, further comprising the step of applying a dielectric coating onto the highly reflective metal layer.

15. The method of claim 11, further comprising the step of applying dielectric layers on the reflective side wall of each of the cavities to turn the reflector into a wavelength-dependent reflector.

16. The method of claim 11, wherein the substrate is a crystalline silicon substrate and the step (A) further comprises the step of anisotropically etching the substrate to form the cavities such that the reflective side wall is defined by the crystallographic planes of the substrate.

17. The method of claim 11, wherein the predetermined angle is approximately 54.7°.

18. The method of claim 11, wherein the step (B) comprises the step of bonding the photo detector wafer onto the substrate using conductive epoxy, solder, or a combination of solder and epoxy.

19. An integrated photonics device, comprising:

(A) a photo detector having an active area;

(B) a substrate having a side surface intersecting a top surface of the substrate at a predetermined angle, the side surface being reflective and the photo detector being bonded onto the top surface of the substrate with the active area of the photo detector facing the side surface such that light traveling parallel to the active area of the photo detector can be reflected onto the active area of the photo detector via the side surface, wherein the integrated photonics device is a discrete device and the substrate only supports the photo detector.

20. The integrated photonics device of claim 19, further comprising a highly reflective metal layer applied on the side surface.

21. The integrated photonics device of claim 20, further comprising metal layers on the top surface and a bottom surface of the substrate, wherein the metal layers are electrically connected to the highly reflective metal layer on the side surface.

22. The integrated photonics device of claim 20, further comprising a dielectric coating on the highly reflective metal layer.

23. The integrated photonics device of claim 19, further comprising dielectric layers on the side surface to form a wavelength-dependent reflector.

24. The integrated photonics device of claim 19, wherein the substrate is a crystalline silicon substrate and the side surface is defined by the crystallographic planes of the substrate.

25. The integrated photonics device of claim 19, wherein the predetermined angle is approximately 54.7°.

* * * * *